NEGATIVE RESISTANCE AMPLIFIER WITH OSCILLATION SUPPRESSION CIRCUIT

Filed Feb. 29, 1960

INVENTOR.
JOHN B. SCHULTZ

BY Eugene M. Whitacre

ATTORNEY

United States Patent Office 3,168,710
Patented Feb. 2, 1965

3,168,710
NEGATIVE RESISTANCE AMPLIFIER WITH OSCILLATION SUPPRESSION CIRCUIT

John B. Schultz, Haddonfield, N.J., assignor to Radio Corporation of America, a corporation of Delaware
Filed Feb. 29, 1960, Ser. No. 11,903
7 Claims. (Cl. 330—34)

This invention relates to amplifiers utilizing negative resistance devices, and particularly to circuit arrangements for such amplifiers whereby efficient amplifier operation may be realized without encountering instability due to spurious or parasitic oscillation.

A variety of negative resistance devices are discussed in an article entitled "Negative Resistance and Devices for Obtaining It," by E. W. Herold, appearing in the October 1935 issue of the Proceedings of the IRE, at pages 1201 through 1223. As noted in the Herold article, two main classes of negative resistances exist: (*a*) a voltage controlled negative resistance; and (*b*) a current controlled negative resistance. In an article entitled "Tunnel Diodes as High Frequency Devices," by H. S. Sommers, Jr., appearing in the July 1959 issue of the Proceedings of the IRE, at pages 1201 through 1206, a particular device of the voltage controlled negative resistance type is discussed in detail. This form of voltage controlled negative resistance device has become known as a tunnel diode, the name being derived from the process of quantum mechanical tunneling of charge carriers, which process, it is theorized, contributes to the production of the negative resistance characteristic in the device. In an article entitled "Low Noise Tunnel Diode Amplifier," by K. K. N. Chang, also appearing in the July 1959 Proceedings of the IRE, at pages 1268 through 1269, an application of the tunnel diode device to amplifier use is described in detail.

An important problem to be considered in the use of negative resistance devices to perform amplifying functions is that of maintaining efficient operation without the danger of instability due to parasitic or spurious oscillation. The spurious oscillation is generally caused by stray lead inductance resonating with the diode capacitance and other circuit capacitances at frequencies outside of the amplifier frequency passband. To minimize the danger of such spurious oscillation, the lead lengths are made as short as possible so that spurious resonances fall beyond the frequency capabilities of the negative resistance device. Where the negative resistance amplifier is transformer coupled to a signal source or a utilization circuit, the stray inductance of the transformer windings and leads are extremely difficult to reduce to the point where spurious oscillation resulting therefrom is not a problem.

It is accordingly an object of this invention to provide an improved signal amplifying system using negative resistance devices.

Another object of this invention is to provide an improved negative resistance amplifier that may be transformer coupled to a signal source or load circuit without danger of spurious oscillation.

An amplifier in accordance with the invention includes a frequency sensitive network connected with the negative resistance device. In accordance with an embodiment of the invention, the frequency sensitive network comprises the series combination of a resistor and a capacitor connected in parallel with a voltage controlled negative resistance device. At the desired amplifier frequency, the reactance of the capacitor is high relative to the other shunt positive impedances in the circuit, so there is no appreciable loss in amplifier gain. However, at higher frequencies the reactance of the capacitor is small relative to the negative resistance of the device, and the resistor is effectively connected across the negative resistance device. The resistance value of the resistor is selected to be smaller than the absolute value of the negative resistance of the diode so that a resultant positive resistance occurs, and stability is insured.

The novel features that are considered to be characteristic of this invention are set forth with particularity in the appended claims. The invention itself, however, both to its organization and method of operation as well as additional objects and advantages thereof, will be best understood from the following description when read in connection with the accompanying drawings, in which:

Figure 1:
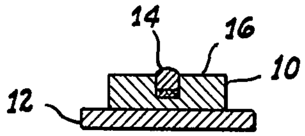
FIGURE 1 is a sectional view of the tunnel diode which may be used in negative resistance amplifying circuits embodying the invention.

Reference is now made to FIGURE 1 which is a diagrammatic sectional view of a typical negative resistance diode that may be used in circuits embodying the invention and which has a thin or abrupt junction diode exhibiting a negative resistance over a region of low forward bias voltages, i.e., less than 0.3 volt. The diode which is known as a tunnel diode, was prepared with a semiconductor having a free charge carrier concentration several orders of magnitude higher than that used in conventional diodes.

A diode which was constructed and could be used in practicing the invention includes a single crystal bar of n-type germanium which is doped with arsenic to have a donor concentration of $4.0\times10^{19}$ cm.$^{-3}$ by methods known in the semiconductor art. This may be accomplished, for example, by pulling a crystal from molten germanium containing the requisite concentration of arsenic. A wafer 10 is cut from the bar along the 111 plane, i.e. a plane perpendicular to the 111 crystallographic axis of the crystal. The wafer 10 is etched to a thickness of about 2 mils with a conventional etch solution. A major surface of this wafer 10 is soldered to a strip 12 of a conductor, such as nickel, with a conventional lead-tin-arsenic solder, to provide a non-rectifying contact between the wafer 10 and the strip 12. The nickel strip 12 serves eventually as a base lead. A 5 mil diameter dot 14 of 99 percent by weight indium, 0.5 percent by weight zinc and 0.5 weight percent gallium is placed with a small amount of a commercial flux on the free surface 16 of the germanium wafer 10 and then heated to a temperature in the neighborhod of 450° C. for one minute in an atmosphere of dry hydrogen to alloy a portion of the dot to the free surface 16 of the wafer 10, and then cooled rapidly. In the alloying step, the unit is heated and cooled as rapidly as possible so as to produce an abrupt p-n junction. The unit is then given a final dip etch for 5 seconds in a slow iodide etch solution, followed by rinsing in distilled water. The etching step cleans the surface of the wafer around the dot to reduce leakage current between the wafer and the dot. A suitable slow iodide etch is prepared by mixing one drop of a solution comprising 0.55 gram potassium iodide, and 100 cm.$^3$ water in 10 cm.$^3$ concentrated acetic acid, and 100 cm.$^3$ concentrated hydrofluoric acid. A pigtail connection may be soldered to the dot where the device is to be used at ordinary frequencies. Where the device is to be used at high frequencies, contact may be made to the dot using low impedance encapsulation techniques.

Other semiconductors may be used instead of germanium, particularly silicon and the III–V compounds. A III–V compound is a compound composed of an element from Group III and an element from Group V of the Periodic Table of Chemical Elements, such as gallium arsenide, indium arsenide and indium antimonide. Where III–V compounds are used, the p and n type impurities ordinarily used in those compounds are also used to form the diode described. Thus, sulfur is a suitable n-type impurity and zinc a suitable p-type impurity which is also suitable for alloying.

Figure 2:
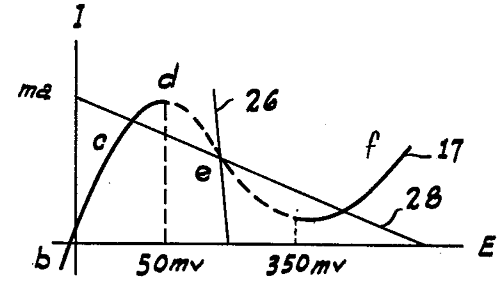
FIGURE 2 is a graph illustrating the current-voltage characteristic of a voltage-controlled negative resistance device of the type shown in FIGURE 1.

The current-voltage characteristic of a typical diode suitable for use with circuits embodying the invention is shown by the curve 17 of FIGURE 2. The current scales depend on area and doping of the junction, but representative currents are in the milliampere range.

For a small voltage in the back or reverse direction, the back current of the diode increases as a function of voltage as is indicated by the region *b* of the curve 17. For small forward bias voltages, the forward current increases as a function of voltage (curve 17, region *c*). The forward current results due to quantum mechanical tunneling. At higher forward bias voltages, about 50 millivolts (mv.), the forward current thought to exist due to tunneling reaches a maximum (region *d*, FIGURE 1), and then begins to decrease. This drop continues (FIGURE 1, region *e*) until eventually, at about 350 mv., normal injection over the barrier becomes important and the characteristic turns into the usual forward behavior (region *f*, FIGURE 2).

The negative resistance of the diode is the incremental change in voltage divided by the incremental change in current, or the reciprocal slope of the (region *e* of FIGURE 1). To bias the diode for stable operation in the negative resistance region of its characteristic requires a suitable voltage source having a smaller internal impedance than the negative resistance of the diode. Such a voltage source has a D.-C. load line 26 as indicated in FIGURE 2, which is characterized by a current-voltage relationship which has a greater slope than the negative slope of the diode characteristic and intersects the diode characteristic at only a single point. If the voltage source has an internal resistance which is greater than the negative resistance of the diode, the source would have a load line 28 with a smaller slope than the negative slope of the diode characteristic as indicated in FIGURE 2, and would intersect the diode characteristic curve at three points. Under the latter conditions the diode is not stably biased in the negative resistance region. This lack of stability is because an incremental change in current through the diode due to transient or noise currents or the like produces a regenerative reaction which causes the diode to assume one of its two stable states represented by the intersection of the load line 28 with the positive resistance portions of the diode characteristic curve.

Figure 3:
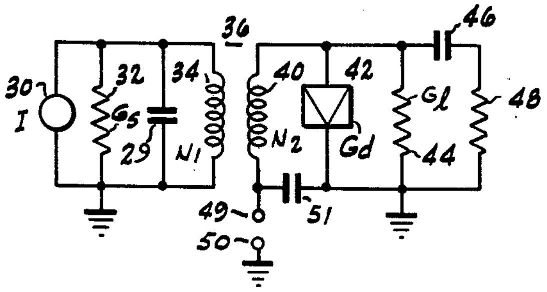
FIGURE 3 is a schematic circuit diagram of an amplifier in accordance with the invention.

A schematic circuit diagram of an amplifying circuit in accordance with the invention is shown in FIGURE 3. A signal source 30 having an equivalent conductance $G_s$ represented by the resistor 32, is connected across the primary winding 34 of a transformer 36. The primary winding 34, which has $N_1$ turns, is tuned to the frequency of a signal to be amplified by a capacitor 29. The transformer 36 also includes a secondary winding 40 having $N_2$ turns, across which is connected a tunnel diode 42. A suitable utilization circuit, not shown, but having an equivalent conductance $G_1$ represented by the resistor 44 is coupled across the tunnel diode 42. In accordance with the invention, the susceptibility of the amplifier to parasitic oscillations due to the stray inductance of the transformer windings 36 and the connecting leads thereto, is reduced by the series combination of a capacitor 46 and a resistor 48 connected in parallel with the diode 42.

Means providing a biasing voltage source for the tunnel diode 42 is connected between a pair of terminals 49 and 50, and a capacitor 51 is connected between the terminal 49 and ground to provide a low impedance bypass for signal frequencies. The diode 42 is biased for stable operation in the negative resistance region of its operating characteristic by the biasing voltage source. As mentioned above, for stable biasing in the negative resistance region, the D.-C. resistance in parallel with the tunnel diode 42 must be less than the absolute value of the negative resistance exhibited by the diode.

Figure 4:
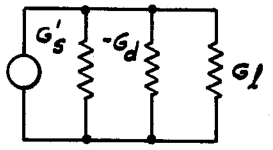
FIGURE 4 is an equivalent circuit diagram of the amplifier circuit of FIGURE 3 at signal frequencies.

FIGURE 4 shows the equivalent circuit of FIGURE 1 at the frequency of amplification. The stray inductances due to the leakage inductance in the transformer and connecting lead lengths etc. may be neglected at the amplifier frequency of operation. The power gain of the circuit can be expressed as follows:

$$P.G.=\frac{4G'_sG_1}{(G'_s+G_1-G_d)^2}$$

where $$G'_s=\left(\frac{N_2}{N_1}\right)^2 G_s$$

For stable operation $$G'_s+G_1>|-G_d|$$

That is, if the total positive conductances in the circuit due to the source and load conductances $G'_s+G_1$ become less than or equal to the negative conductance $G_d$ exhibited by the diode, then the circuit is unstable and tends to oscillate.

Figure 5:
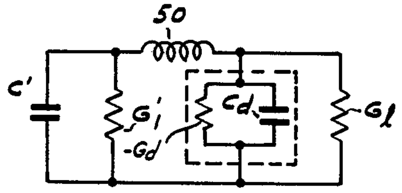
FIGURE 5 is an equivalent circuit diagram of the amplifier circuit of FIGURE 3 for frequencies above the signal frequency.

FIG. 5 shows the equivalent circuit of the amplifier of FIGURE 1 at some frequency much higher than the amplifier frequency of operation. The inductor 50 represents the stray inductance in the transformer windings and its leads. At some high frequency $F_h$, stray inductance $L_{50}$ resonates with a capacitance C′, which is the capacitance reflected from the signal source circuit, and a capacitance $C_d$, which is the capacitance between the electrodes of the diode. If the capacitance of C′ exceeds that of $C_d$, then the loading of the source $G'_s$ on the tunnel diode will be reduced. If the effective source conductance is reduced sufficiently, then the total positive conductance of the circuit may fall to a value equal to or less than the negative conductance of the diode 42 so that spurious oscillations will occur.

In accordance with the invention the series combination of the capacitor 46 and resistor 48 is connected in parallel with the tunnel diode 42. At the desired frequency of amplification $F_o$, the capacitive reactance of the capacitor 46, $X_{C46}$, is selected to be much greater than (for example about 10 times) the equivalent impedance of the source and load circuits combined, $$X_{C46}\gg\frac{1}{G_s+G'_s}$$

In other words the shunt impedance of the series network comprising the capacitor 46 and the resistor 48 is high at the frequency of amplification relative to the other impedances in the circuit so that there is no shunting of the signals through this network. However at high frequencies the capacitive reactance of the capacitor 46 is low relative to the negative resistance of the diode 42, $$X_{C46}\ll\frac{1}{|-G_d|}$$

the resistance of the resistor 48 is selected to be lower than the negative resistance of the diode 42 so that stability is insured $$R_{48}<\frac{1}{|-G_d|}$$

In other words at frequencies wherein the circuitry is susceptible to spurious oscillation due to stray inductance or the like, the capacitive reactance of the capacitor 46 is quite small, and effectively inserts the resistor 48 across the diode 42. The relative resistance values of the resistor 48 and the tunnel diode 42 are such that the resistor 48 effectively damps the tunnel diode 42 at higher frequencies and therefore tends to prevent spurious oscillation.

What is claimed is:

1. A negative resistance amplifier comprising in combination, a voltage controlled negative resistance diode, means providing a bias source connected to bias said diode to exhibit a negative resistance, said bias source presenting an effective D.C. resistance in parallel with said diode that is less than the absolute value of the negative resistance exhibited by said diode, means providing signal input and output circuits coupled across said diode, the combined impedances of said signal input and output circuits at signal frequencies being less than the absolute value of negative impedance of said diode at signal frequencies, and a frequency sensitive circuit including the series combination of a capacitor and resistor connected in parallel with said diode, said frequency sensitive circuit having a higher impedance than the absolute value of the negative impedance of said diode at signal frequencies, and a lower impedance than the absolute value of the negative impedance of said diode at frequencies higher than said signal frequency, but less than the cut-off frequency of said diode.

2. A negative resistance amplifier comprising in combination, a voltage controlled negative resistance diode, means providing a bias source connected to bias said diode to exhibit a negative resistance, said bias source presenting an effective D.C. resistance in parallel with said diode that is less than the absolute value of the negative resistance exhibited by said diode, a transformer having at least a primary and a secondary winding, means connecting said diode in parallel with one of said primary and secondary windings, a signal input circuit connected in parallel with said primary winding, a signal output circuit connected in parallel with said secondary winding whereby said signal input circuit and signal output circuit provide a combined impedance effectively in parallel with said diode that is less than the absolute value of the negative impedance of said diode at signal frequencies, and a frequency sensitive circuit including the series combination of a capacitor and a resistor connected in parallel with said one of said primary and secondary windings, said capacitor having a higher impedance than the absolute value of the negative impedance of said diode at signal frequencies, and said resistor having a resistance value such that the combined impedance of said resistor and capacitor is less than the absolute value of the negative impedance of said diode at frequencies higher than said signal frequency, but less than the cut-off frequency of said diode.

3. A negative resistance amplifier as defined in claim 2 wherein said bias source means is connected to said diode through said one of said primary and secondary windings.

4. A negative resistance amplifier as defined in claim 3 wherein said one of said primary and secondary windings is said secondary winding.

5. In a negative resistance amplifier of the type including a voltage controlled negative resistance diode, a signal source circuit transformer coupled to said diode, a signal load circuit connected effectively in shunt with said diode, and which is subject to spurious oscillation at a frequency above the frequency of applied signals due to the resonances of stray inductances with the inherent capacitance of said diode, the combination of a frequency sensitive network comprising a capacitor and a resistor connected in series, said capacitor having a high impedance at signal frequencies relative to the impedances of said signal source circuit and said signal load circuit effectively in parallel with said diode, and an impedance at high frequencies which is smaller than the absolute value of negative resistance of said diode, said resistor having a resistance value that is smaller than the negative resistance of said diode, and means connecting the series combination of said resistor and said capacitor in parallel with said diode.

6. A negative resistance circuit comprising in combination a negative resistance diode, means providing a biasing circuit for biasing said diode to exhibit a negative resistance, and a frequency responsive circuit including the series combination of a capacitor and a resistor connected in parallel with said diode, said capacitor exhibiting throughout a predetermined band of frequencies a reactance which in combination with the resistance of said resistor presents an impedance which is substantially greater than the absolute value of minimum negative resistance of said diode and a reactance at frequencies higher than said predetermined band which in combination with the resistance of said resistor presents an impedance which is lower than the absolute value of minimum negative resistance of said diode, said resistor having a resistance value less than the absolute value of the minimum negative resistance of said diode.

7. A negative resistance amplifier comprising in combination a negative resistance diode, means providing a biasing circuit for biasing said diode to exhibit a negative resistance, said biasing circuit connected in series for direct current with said diode and having a direct current resistance which is less than the absolute value of the minimum negative resistance of said diode, means providing signal input and output circuits coupled to said diode and presenting a combined impedance in parallel with said diode which is less than the absolute value of minimum negative resistance of said diode throughout the amplifier frequency passband, and a frequency responsive circuit including the series combination of a capacitor and a resistor connected in parallel with said diode, said resistor having a resistance value less than the absolute value of minimum negative resistance of said diode, said capacitor exhibiting a reactance which in combination with said resistance presents a combined impedance which is substantially higher than the absolute value of minimum negative resistance of said diode at signal frequencies but which is lower than the absolute value of minimum negative resistance of said diode at frequencies higher than said signal frequencies.

References Cited in the file of this patent

UNITED STATES PATENTS

| | | |
|---|---|---|
| 2,565,497 | Harling | Aug. 28, 1951 |
| 2,986,724 | Jaeger | May 30, 1961 |
| 3,061,786 | Theriault | Oct. 20, 1962 |
| 3,116,459 | Tiemann | Dec. 31, 1963 |

FOREIGN PATENTS

| | | |
|---|---|---|
| 158,879 | Australia | Sept. 16, 1954 |

OTHER REFERENCES

"Biasing Methods for Tunnel Diodes," Ray P. Murray, Electronics, June 3, 1960, pages 82, 83.